United States Patent
Witherspoon et al.

(10) Patent No.: US 6,356,002 B1
(45) Date of Patent: *Mar. 12, 2002

(54) ELECTRICAL SLIP RING HAVING A HIGHER CIRCUIT DENSITY

(75) Inventors: Barry Kent Witherspoon, Blacksburg; Larry Dean Vaught, Pembroke, both of VA (US)

(73) Assignee: Northrop Grumman Corporation, Los Angeles, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/246,098

(22) Filed: Feb. 8, 1999

(51) Int. Cl.$^7$ ................................................ H01R 39/08
(52) U.S. Cl. ...................................................... 310/232
(58) Field of Search ........................ 310/232, 42, 127, 310/128, 143, 147, 148, 151, 229, 231, 219; 29/597; 439/26

(56) References Cited

U.S. PATENT DOCUMENTS

| | | | | |
|---|---|---|---|---|
| 2,696,570 A | * | 12/1954 | Pandapas | 310/232 |
| 2,703,868 A | * | 3/1955 | Rausenberger | 439/26 |
| 3,066,386 A | * | 12/1962 | Filipczak | 29/597 |
| 4,510,276 A | | 4/1985 | Leech et al. | 523/427 |
| 4,878,294 A | | 11/1989 | Dugan et al. | 29/852 |
| 5,690,498 A | | 11/1997 | Sobhani | 439/22 |
| 5,734,218 A | | 3/1998 | Crockett et al. | 310/232 |
| 5,805,115 A | | 9/1998 | Pellerin et al. | 343/763 |

FOREIGN PATENT DOCUMENTS

DE    AT 319 390 B    12/1974

* cited by examiner

*Primary Examiner*—Nestor Ramirez
*Assistant Examiner*—Guillermo Perez
(74) *Attorney, Agent, or Firm*—Lowe Hauptman Gilman & Berner, LLP

(57) ABSTRACT

Disclosed is a method of manufacturing a slip ring printed circuit board which includes forming a plurality of concentric spaced electrical contacts on one side of a non-conductive base and forming interconnecting electrical paths on an opposite side of the non-conductive base. The method of manufacturing a slip ring printed circuit board also includes electrically connecting the electrical contacts and the interconnecting electrical paths, depositing copper on the electrical contacts to form electrical rings and etching a groove into each of the electrical rings.

21 Claims, 7 Drawing Sheets

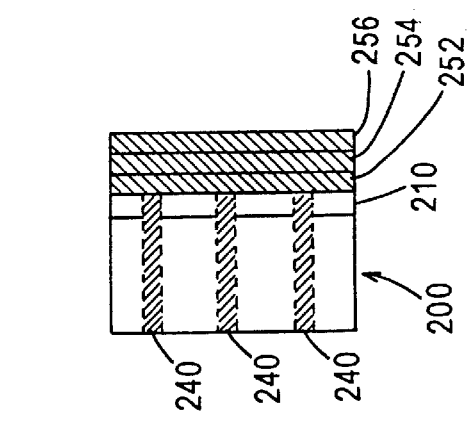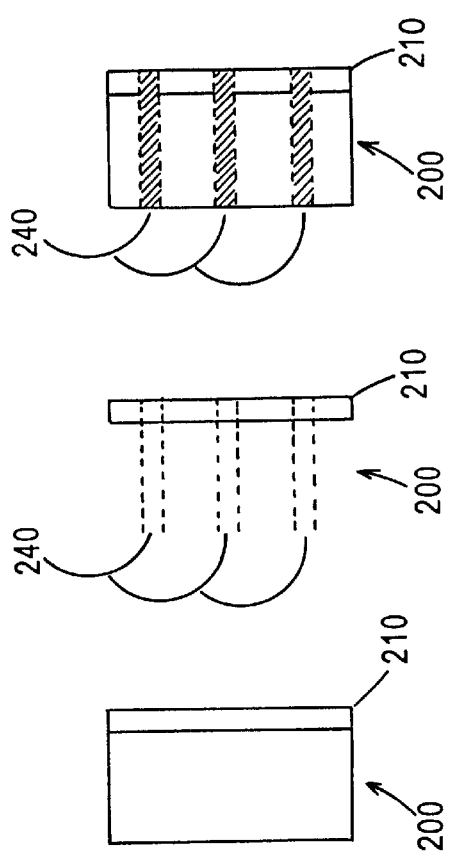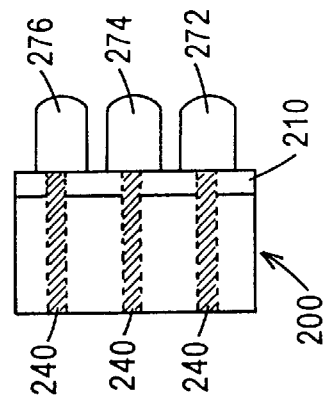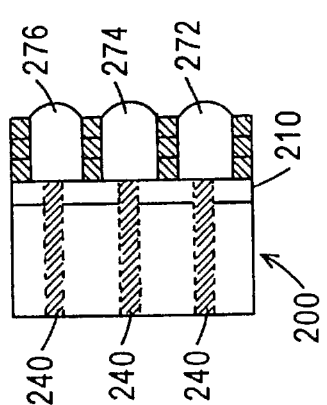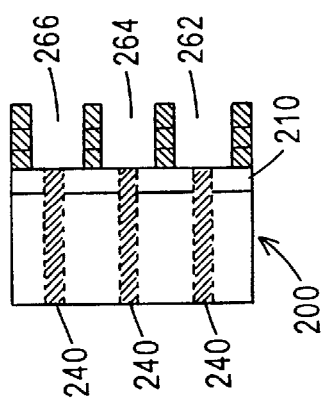

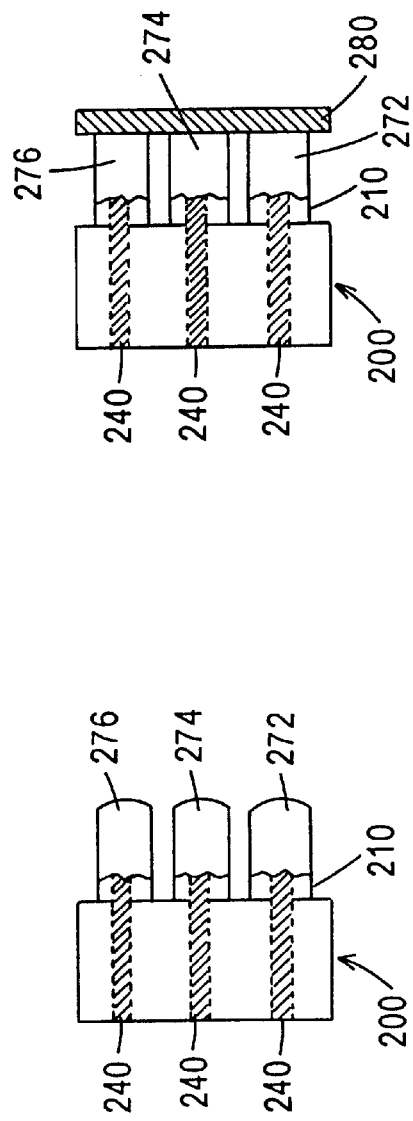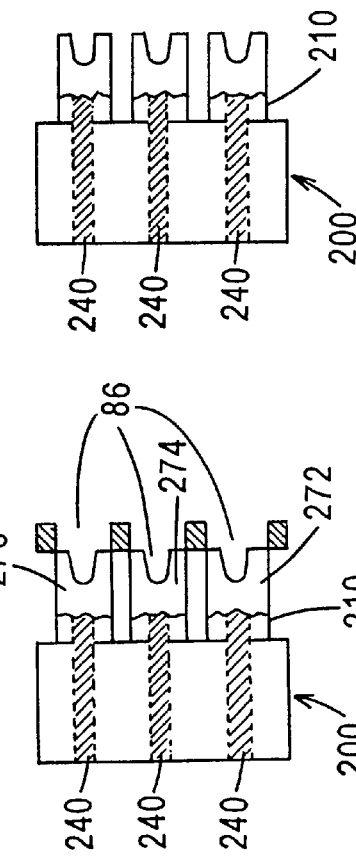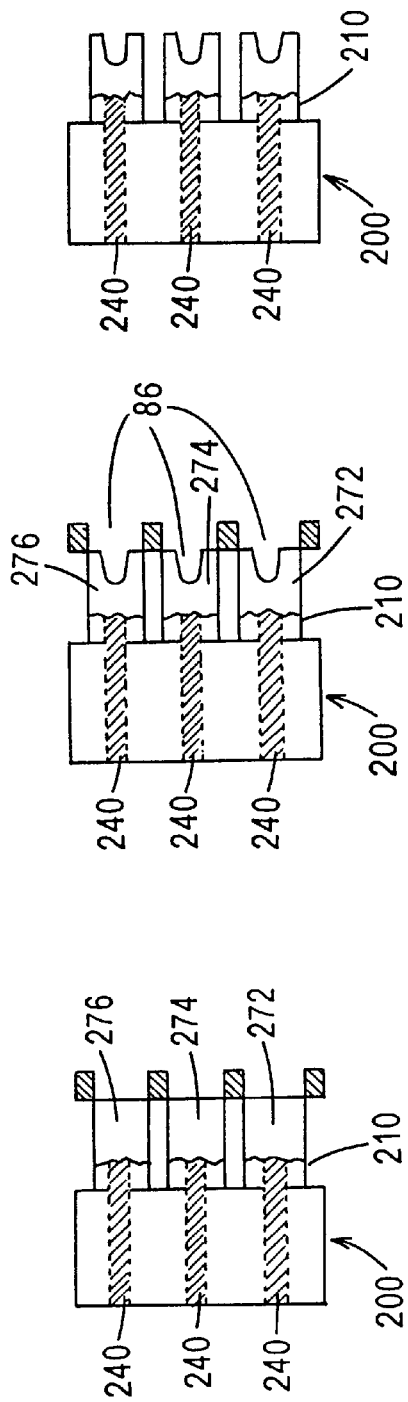

ELECTRICAL SLIP RING HAVING A HIGHER CIRCUIT DENSITY

FIELD OF THE INVENTION

The present invention relates generally to electrical slip rings, and more particularly, to an electrical slip ring having a higher circuit density than prior art. Advantageously, the present invention is directed to flat composite electrical slip ring in which the electrical rings are spaced in close proximity to each other.

BACKGROUND OF THE INVENTION

Electrical slip rings are well known devices for communicating electrical signals from one structural member to another where one of the structural members is rotatable with respect to the other. Such a slip ring apparatus, for example, may comprise a relatively stationary annular base member, which has a plurality of conductive rings extending annularly there around. One or more electrically conductive brushes are arranged on a relatively rotatable structural member to rotate about the stationary annular base member and each of the brushes is arranged to contact a surface of one of the conductive rings thereby forming a series of electrical connections between the two structural members.

A flat or "pancake" slip ring is such a device of minimal height or thickness for military or commercial environments where space for the slip ring is very limited. The conductive rings forming the slip ring base generally are formed from materials having a thickness from 0.003 to 0.040 inches with most such materials having a thickness in the range of 0.006 to 0.016 inches. Characteristically, the rings for such a slip ring base are approximately 0.015 to 0.020 inches in width. Spaces between the rings or the ring pitch are characteristically approximately of the same dimension.

A grooved plate process is the most common method of manufacturing pancake slip rings. In the grooved plate process, a grooved plate is prepared by rough machining a brass plate to approximately a "grooved plate" shape. The grooved plate is then annealed to minimize distortion during subsequent plastic curing and final machining. One side of the grooved plate is then machined to final "grooved plate" shape. Peaks correspond to the bottom of the future rings, and valleys correspond to the future insulation barriers between rings. The "grooved plate" is then plated with nickel and a gold strike. A lead wire is soldered or welded to individual ring features on the grooved plate. A glass cloth is then bonded to the plate to prevent leads from entering the valleys of the plate (the future barriers between rings). The plate and lead assembly is then loaded into a metal mold which contains features to provide for internal lead routing, lead exist positioning, and other rotor geometry requirements. The mold is vacuum cast with a liquid epoxy to completely fill the internal detail of the mold. At this point, the assembly is a single piece with a continuous plate on one or two sides with internal epoxy insulation. The final machining step turns the exposed surface of the plate to separate the plate into individual concentric rings separated from each other with epoxy (filling the former valleys in the plate). After the rings are separated, insulating barriers between the rings are machined to final dimensions. In addition, at this step the ring surface is machined to final dimension. The ring groove pattern may be V, U or double-V shaped. In addition to ring shape, the rings are machined to the required surface roughness. The rotor is then nickel plated and then plated with precious metal (usually gold or silver). This process is complex and the density of slip rings is limited by the machining requirements.

An electroformed rings process is another known process. A rotor and lead assembly is prepared by loading lead wire into a mold which contains features to provide for internal lead routing, lead exit positioning, and other rotor geometry requirements. The mold is cast with a liquid epoxy to completely fill the internal detail of the mold and encapsulate the lead wires. Grooves are machined which will contain the rings. Starter rings are prepared as follows. At the bottom of the ring groove, the lead wire conductor is exposed and prepared (generally by applying a fillet of conductive epoxy). The inside walls of the ring groove are coated with conductive plastic to form a continuous conductive starter ring for plating. The ring is electroformed by plating copper onto the starter ring using high build plating technology. High build plating technology or high buildup electroforming is a method of creating a thicker ring cross-section by plating up the starter ring, usually in a copper bath. The starter rings may be plated up with or without dielectric barriers between the rings. At this point, the assembly is a single piece with discrete rings and leads embedded in epoxy insulation. The final machining step will form final shape and texture of the rings and insulating barriers between the rings. The final rotor is nickel plated and then plated with precious metal (usually gold or silver). The disadvantages of the electroformed rings process include limited ring thickness buildup unless barriers are present. Extensive machining is required to create dielectric barriers which allow a buildup of thicker rings. Due to the lengthy times required to electroform the rings, plating solution can damage the slip ring materials, leak into loads embedded in the dielectric causing lead damage and electrical insulation failures. Dielectric materials can interfere with the electroforming process. Ring sides cannot be sealed with nickel allowing corrosion products to form and contaminate the electrical contacts. The contaminants will lead to contact failure and electrical shorts. This is the most significant drawbacks of conventional electroformed rings.

More recent requirements using an electrical slip ring assembly in a Forward Looking Infrared Radar (FLIR) platform have severe space requirements than can be accommodated by either of the grooved plate process or the electroformed rings process. The FLIR systems are used for surveillance, reconnaissance, rangefinder, targeting, and fire control applications. These FLIR platforms all impose severe requirements on the electrical slip ring, including a high circuit density in which many circuits are required and space for the slip ring is always limited. Another requirement is for high bandwidth and low noise for the digitized video signals that pass through the electrical slip ring assembly. Yet another requirement is for low temperature operations in which the electrical slip ring assembly can function over the temperature range of −54° C. to +60° C.

SUMMARY OF THE INVENTION

It is an object of the present invention to provide a flat composite electrical slip ring having a higher circuit density than prior art slip rings.

It is another object of the present invention to provide an electrical slip ring apparatus in which the electrical slip rings are not mechanically machined.

It is yet a further object of the present invention to provide an electrical slip ring which is reliable on the operation, easy to manufacture and cost effective.

These and other objects of the present invention are achieved using three related processes. These processes include double-sided printed circuit board technology, copper electroforming, and chemical machining. Using the present invention, double-sided copper clad glass reinforced epoxy laminate (FR4) is coated with a photosensitive polymer that is imaged using a photographic negative. Following exposure with an intense ultraviolet light source, the photosensitive polymer is then developed with solvent that selectively dissolves away unexposed areas of the resist. When the resist is removed, copper is exposed for subsequent etching.

The photo imaged material is then placed in a copper etchant that removes the exposed copper. Areas protected by the photoresist are unetched and form the interconnecting electrical passages on one side. Holes are subsequently drilled through the etched material to electrically connect the two sides. The connections are formed utilizing plated through-hole processes and/or by filling the holes with a conductive material, such as silver filled epoxy.

Once the through-hole interconnections are formed, photoresist is again applied to both sides of the slip ring circuit boards. A single layer of resist is applied to the electrical interconnects and multiple layers are sequentially applied to the opposite side. The multiple layers of photoresist are then exposed with ultraviolet light through a photo tool containing multiple concentric rings. After the image is developed, copper is then electroformed up between the concentric rings of photoresist to form the copper rings. After the resist between the electroformed rings is removed, the electroformed rings are subsequently separated by etching away the thin layer of copper between the base of the rings. Electro formed rings are subsequently recoated with photosensitive polymer and reimaged with a photo tool to allow etching of U-grooves in the ring. These grooves, after a gold allow plating, including small percentage of nickel is applied, form the contact surfaces for the mating brush contacts. The nickel in the allow plating significantly increases the hardness and wear resistance of the gold electrodeposit while maintaining a low electrical contact resistance. The nickel also promotes chemisorption of the lubricant, thus further reducing contact wear.

The slip ring is then mated with brush blocks to form a slip ring apparatus. The resulting slip ring apparatus has a higher circuit density than is readily achievable with conventional slip ring manufacturing methods while having a lower per circuit cost.

The foregoing objects of the present invention are also achieved by manufacturing a slip ring printed circuit board including forming a plurality of concentric spaced electrical contacts on one side of a non-conductive base and forming interconnecting electrical paths on an opposite side of the non-conductive base. Manufacturing a slip ring printed circuit board also includes electrically connecting the electrical contacts and the interconnecting electrical paths, depositing copper on the electric contacts to form electrical rings and etching a groove into each of the electrical rings.

The foregoing objects of the present invention are also achieved by a method of manufacturing a slip ring printed circuit board includes forming a plurality of concentric spaced electrical contacts on one side of a non-conductive base and forming interconnecting electrical paths on an opposite side of the non-conductive base. A method of manufacturing a slip ring printed circuit board also includes electrically connecting the electrical contacts and the interconnecting electrical paths, depositing copper on the electrical contacts to form electrical rings and etching a groove into each of the electrical rings.

The foregoing objects of the present invention are also achieved by an electrical slip ring apparatus includes an annular base member and at least one brush block assembly secured to the annular base member having a plurality of brushes. A flat composite electrical slip ring includes an electrically non-conductive base and a plurality of concentric spaced electrical rings located on one side of each of the electrically non-conductive base. The slip rings are spaced from adjacent electrical rings at a distance of approximately 0.70 or greater. Interconnecting electrical paths are located in an opposite side of the electrically non-conductive base. Connecting means are provided for connecting at least some of the electrical rings to the interconnecting electrical paths.

The foregoing objects of the present invention are also achieved by a flat composite electrical slip ring product produced by the method includes forming a plurality of concentric spaced electrical contacts on one side of a nonconductive base and forming interconnecting electrical paths on an opposite side of the nonconductive base. The foregoing objects of the present invention are also achieved by a method of manufacturing a slip ring printed circuit board also includes electrically connecting the electrical contacts and the interconnecting electrical paths, depositing copper on the electrical contacts to form electrical rings and etching a groove into each of the electrical rings.

Still other objects and advantages of the present invention will become readily apparent to those skilled in the art from the following the detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIGS. 5A–5L depict the steps of manufacturing an electrical slip ring according to the present invention.

BEST MODE FOR CARRYING OUT THE INVENTION

Figure 1:
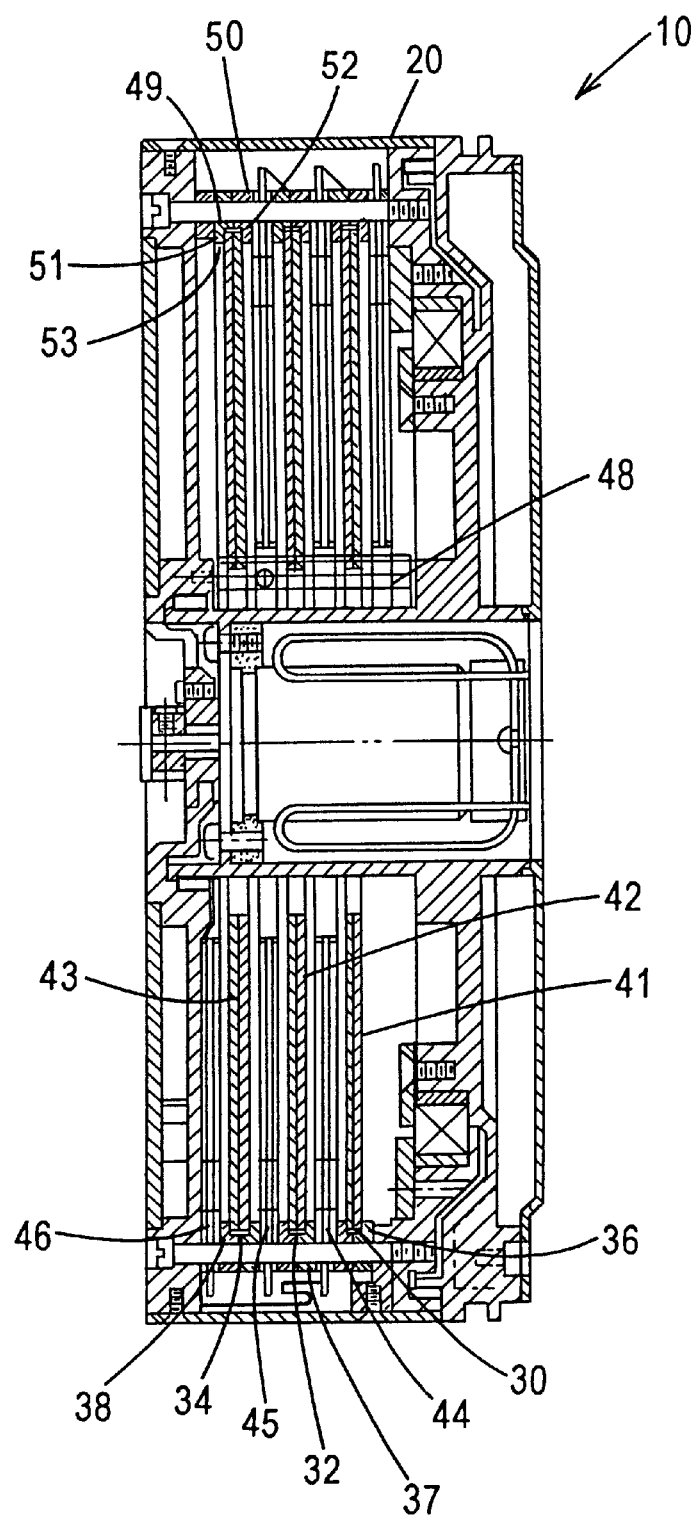
FIG. 1 is a side cross-sectional elevational view of an electrical slip ring device.

Referring now to FIG. 1, an electrical slip ring apparatus 10 is depicted. The electrical slip ring apparatus 10 is depicted in FIG. 1 with the electrical slip rings extending vertically, although it should be understood that the present invention is usable in any orientation. Accordingly, terms such as "above", "below", "right", and "left", as used herein, are to be construed in the relative sense. The present patent application incorporates by reference in its entirety into this specification, U.S. patent application Ser. No. 08/887,697 filed Jul. 3, 1997, entitled "METHOD OF MANUFACTURING A FLAT SLIP RING ASSEMBLY", and assigned to the instant assignee.

The electrical slip ring apparatus 10 includes a cylindrical housing 20 including three stacked electrical slip ring assemblies 30, 32, 34 according to the principles of the present invention. Although three slip ring assemblies are depicted any number of slip ring assemblies can be used. The slip ring assemblies 30, 32, 34 can be identical but need not be identical depending on the application. Each electrical slip ring assembly 30, 32, 34 has an annular body 36, 37, 38 secured to the housing 20 and an electrical slip ring 41, 42, 43, respectively. As depicted in FIG. 1, the cross-section of the bodies 36, 37, 38 are U-shaped. The electrical slip rings 41, 42, 43 are freely rotatable relative to the bodies 36, 37, 38 and each is connected to a rotatable hub 48 for rotation therewith. A plurality of shields 44, 45, 46 are located inside the housing 20 and are connected to the housing 20. The shields 44, 45 are positioned between electrical slip ring assemblies 30, 32 and 32, 34, respectively. For example, body 38 is formed in two halves 49, 50. Each half 49, 50 has a radially inwardly extending flange 51, 52, respectively, forming a cylindrical opening 53. A plurality of bolts are used to connect the slip ring assemblies 30, 32, 34 and shields 44, 45, 46. The electrical slip ring apparatus 10 is otherwise conventional and is not described in detail herein.

Figure 2A:
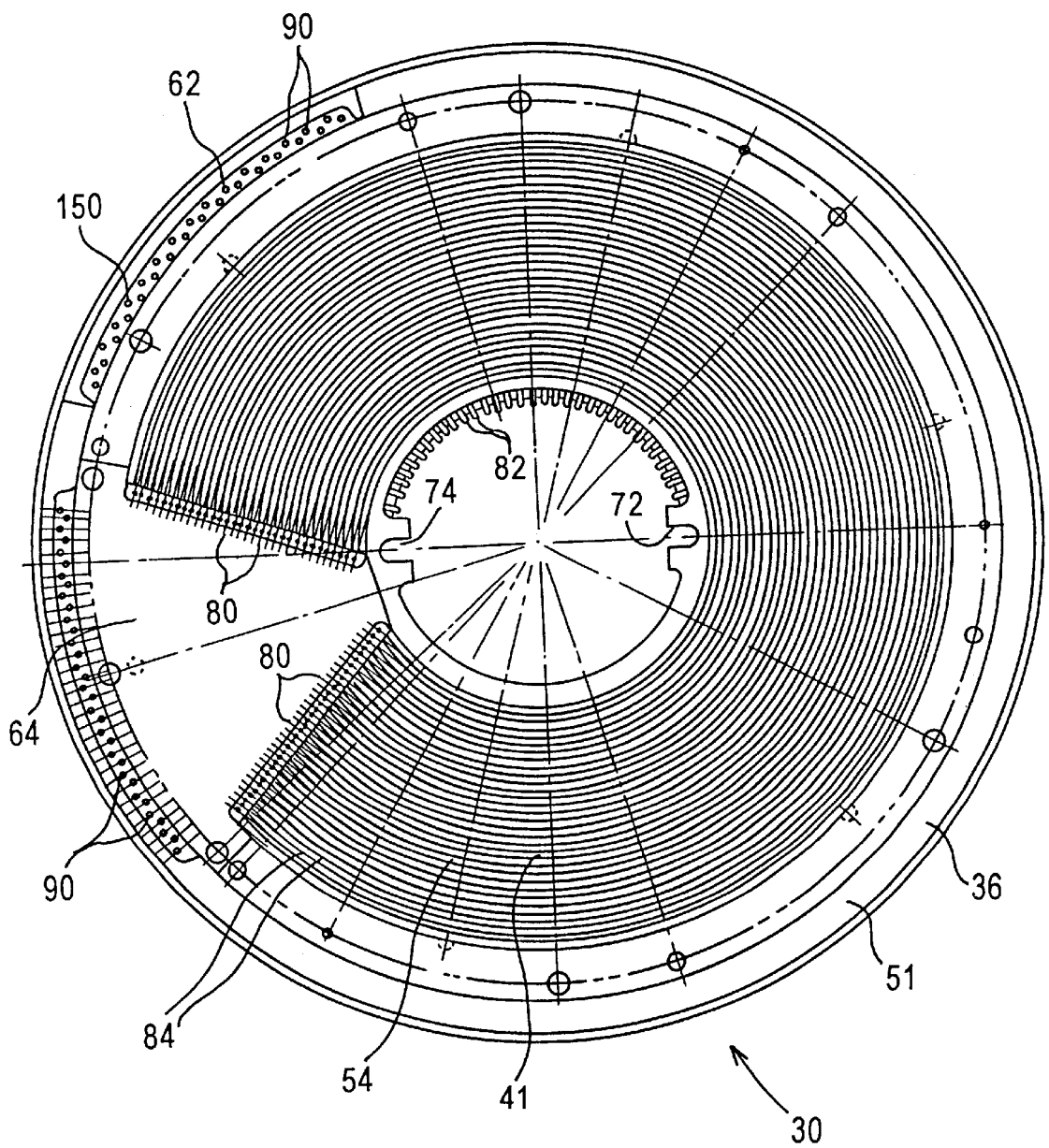
FIGS. 2A and 2B are top plan and bottom plan views of an electrical slip ring apparatus according to the present invention.
Figure 2B:
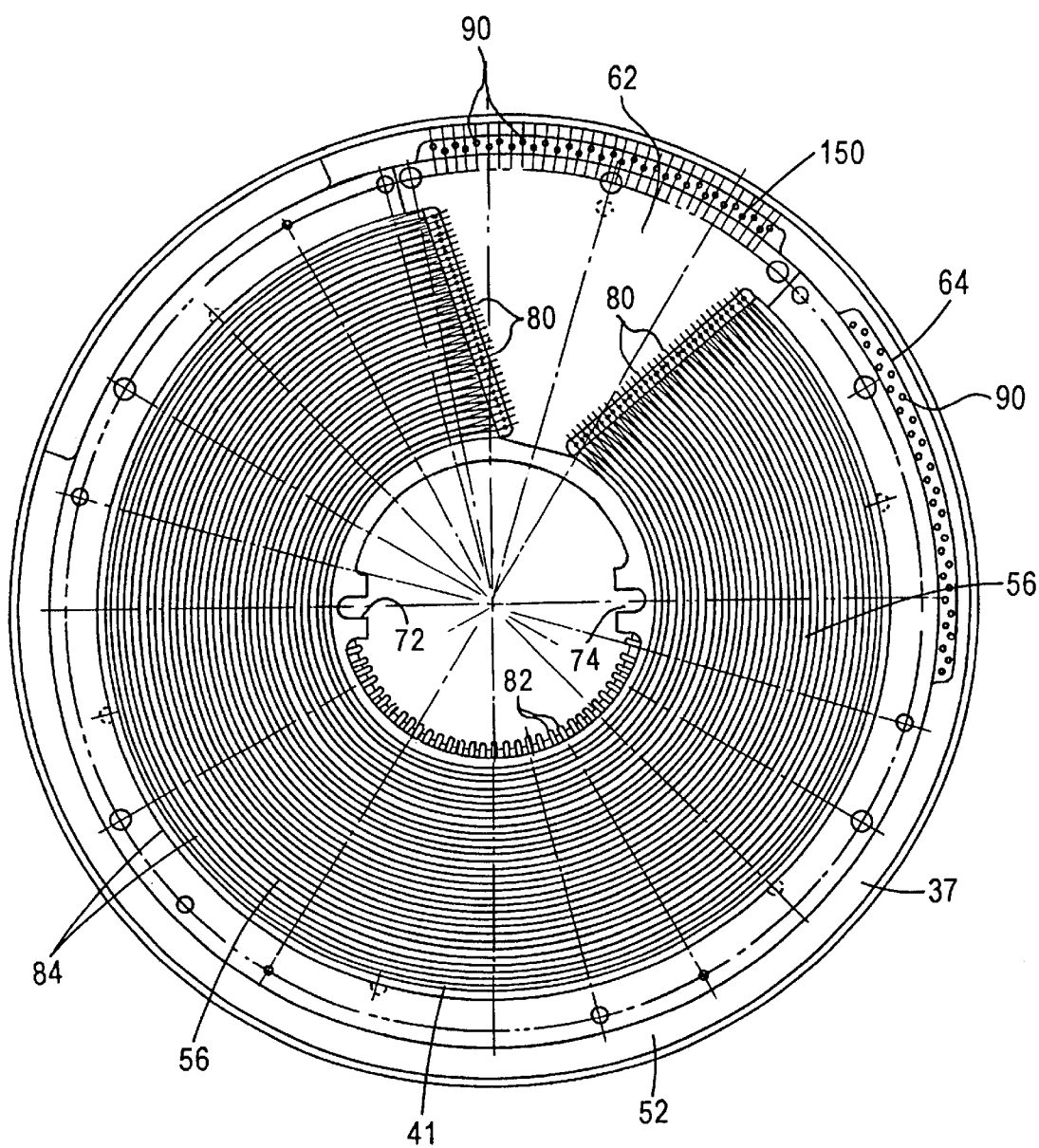

Refer now to FIGS. 2A and 2B which depict opposite sides of any one of the electrical slip ring assemblies 30, 32, 34 but for brevity only electrical slip ring assembly 30 is described. The electrical slip ring assembly 30 includes the electrical slip ring 41 which includes two preferably identical electrical slip ring halves 54, 56 bonded together and two preferably identical brush block assemblies 62, 64. The brush block assemblies 62, 64 are fixedly connected to the flanges 51, 52, respectively and extend radially inwardly therefrom. The electrical slip ring halves 54, 56 can be of different configurations. The brush block assemblies can also be of different configurations. The brush block assemblies 62, 64 are pie shaped with one edge fixedly connected to a corresponding flange 51, 52. Each brush block assembly 62, 64 is cantilevered from the flange 51, 52 and so rigidity of the printed circuit board of each brush block assembly 62, 64 is important in order to maintain uniform contact between the brushes and their respective electrical slip rings. The annular body 36 and brush block assemblies 62, 64 remain stationary relative to the housing 20 during the operation of the electrical slip ring apparatus 10 while the electrical slip ring assemblies 30, 32, 34 rotate. The brush block assemblies 62, 64 are located on opposite sides of the composite electrical slip ring 50 and are angularly spaced from each other in a circumferential direction. A plurality of leads 82 are electrically connected at an inner periphery of the electrical slip ring 41 to a rotary member (not shown). Each electrical slip ring half 54, 56 has a plurality of concentric radially spaced electrical rings 84. Each brush block 62, 64 has a plurality of brushes 80 and is electrically connected to a corresponding plurality of leads 90. The leads 90 are soldered to corresponding connecting points 150. The electrical slip ring 50 has diametrically opposite radial slots 72, 74 for engaging the hub 48.

Figures 3A, 3B:
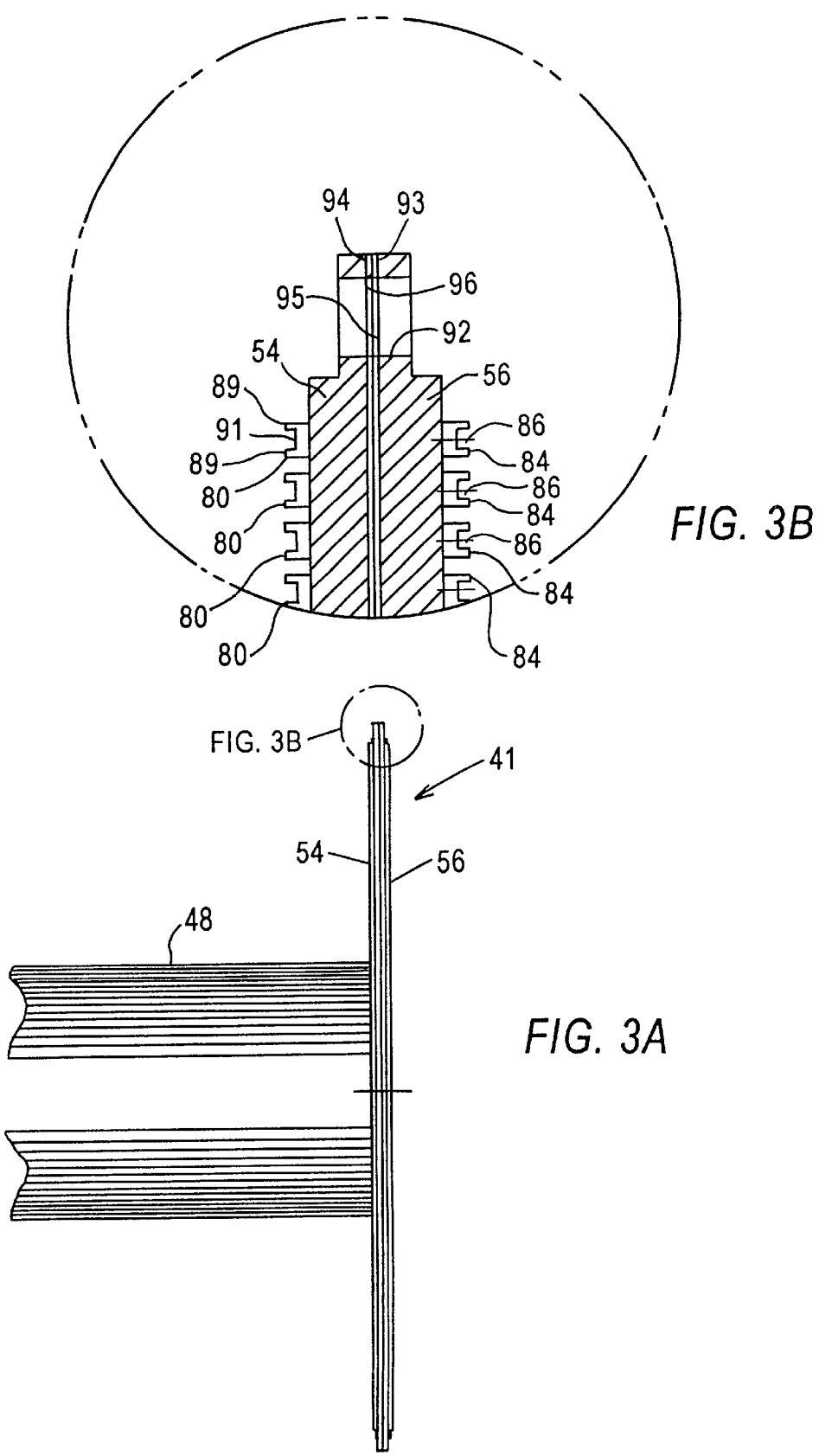
FIG. 3A is a side elevational view of a composite electrical slip ring.
FIG. 3B is an enlarged side cross-sectional elevational view of the composite electrical slip ring apparatus according to the present invention.

Refer now to FIG. 3A where a composite electrical slip ring 50 is depicted, according to the present invention, connected to the hub 48. As depicted in FIG. 3B, the composite electrical slip ring 50 includes the two electrical slip ring halves 54, 56 bonded together with epoxy polyamide adhesive to form the composite electrical slip ring 41. As depicted in FIG. 3B, the slip ring halves 54, 56 have a plurality of concentric spaced electrical rings 84. Each ring 84 has a groove 86 for receiving a corresponding brush 80. The groove is defined by a pair of side walls 89 and a radiused surface 91 connecting the sidewalls 89. Each of the electrical slip ring halves 54, 56 has a back surface 93, 94 to which electrical interconnecting circuits 95, 96 are located.

Figure 4A:
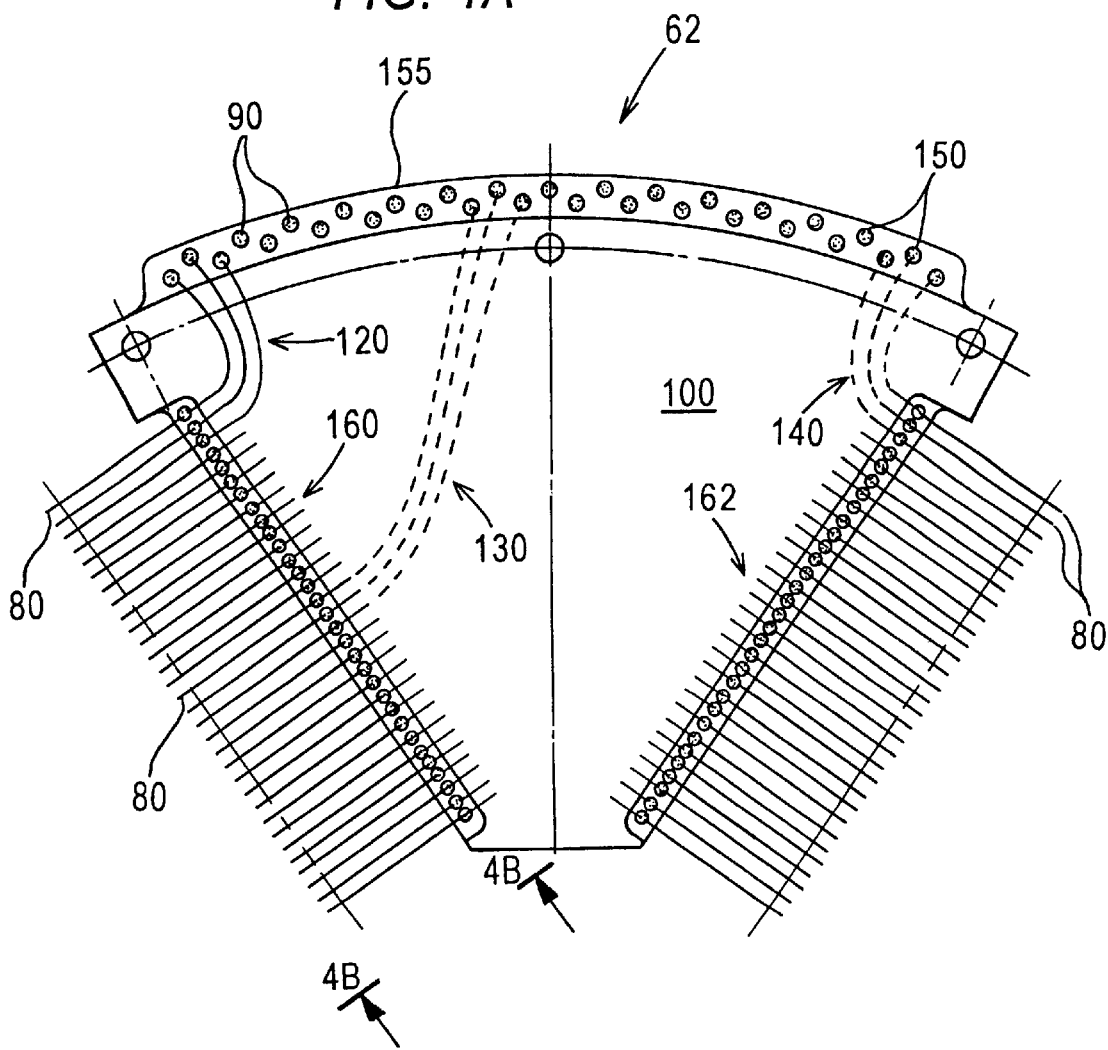
FIG. 4A depicts a brush block assembly according to the present invention.
Figure 4B:
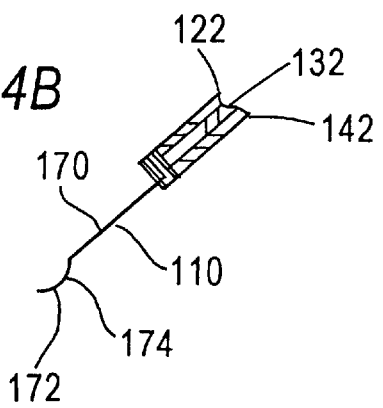
FIG. 4B is a side elevational view of a brush of FIG. 4A taken along line 4B—4B in FIG. 4A.

Refer now to FIGS. 4A and 4B which depict one of the brush block assemblies 62. The brush block assembly 62 is mounted on a printed circuit board 100. Because of the high circuit density of the electrical slip ring, the brush block 62 must also be formed with a high circuit density corresponding to the circuit density of the electrical slip ring 41. To accommodate the high circuit density, the printed circuit board is preferably formed of multiple layers (three layers 122, 132, 142 are depicted in FIG. 4B, although any number of layers can be used) of circuit boards each having circuit traces formed thereon. Advantageously, the use of multiple layers between each layer of circuit layers provides a ground plane between each layer of circuit layers. As depicted in FIG. 4A, there are three sets of circuit traces, each connected to a corresponding brush 80. A first set of circuit traces 120 (indicated by solid lines) is on a first layer 122, a second set of circuit traces 130 (indicated by long dashed lines) is on a second layer 124, and a third set of circuit traces 140 (indicated by short dashed lines) on a third layer 142 carries an electrical signal to/from connection points 150 on the printed circuit board 100 of the electrical slip ring apparatus 10 to/from a corresponding brush 80. The printed circuit boards are preferably formed of glass reinforced epoxy laminate (FR4) and are bonded together using an epoxy polyamide cement.

As depicted in FIG. 4A, printed circuit board 100 has a pie shaped configuration having a circumferentially extending portion 155 and two radially inwardly extending portions 160, 162. Connection points 150 are located on the circumferentially extending portion 155 and the brush blocks 80 are mounted to each of the radially inwardly extending portions 160, 162 and extend circumferentially outwardly beyond the printed circuit board 100. The leads 90 are soldered to connection points 150.

Each of the brushes 80 is electrically connected to a corresponding trace on one of layers 122, 132, 142. As depicted in FIG. 4B, brush 80 is connected to a trace in layer 142. The brush 80 has a leg portion 170 and a curved portion 172 at a distal end thereof. The curved portion 172 has a rounded surface 174 in mechanical and electrical contact with an electrical ring 84 in the electrical slip ring 41. Each brush is plated with nickel plating and then gold plated.

Referring now to FIGS. 5A–5L, the process of manufacturing an electrical slip ring according to the present invention is illustrated. The process described below is for manufacturing each of the electrical slip ring halves 54, 56 described above having densely packed electrical rings 80. It should be noted that any number of electrical rings can be formed on a substrate according to the present invention although only three rings are depicted in the partial elevational side views of FIGS. 5A–5L for ease of discussion.

A double sided copper laminate is first formed, although as depicted in FIG. 5A, only one copper layer is depicted on which the electrical rings are formed. The electrically interconnecting circuits are not described for clarity. As depicted in FIG. 5A, a substrate 200 has a copper layer 210 laminated thereon. As depicted in FIG. 5B, a plurality of holes 240 are drilled through the substrate 200 and the copper layer 210. The copper layer 210 is then coated with a photosensitive polymer and exposed to intense ultraviolet light through a photographic negative. The other side is similarly exposed to form the electrical interconnections. The photosensitive polymer is then developed with a solvent that selectively dissolves away unexposed areas of the resist leaving rings of developed resist 220 as depicted in FIG. 5A.

As depicted in FIG. 5C, the holes 240 are plated with an electrically conductive material utilizing plated through holes processes and/or by filling the holes with an electrically conductive material, such as silver filled epoxy. As depicted in FIG. 5D, multiple layers of photoresist 252, 254, 256 are applied to the copper layer 210. Photoresist is again applied to both sides of the slip ring circuit boards. Although not depicted in FIG. 5, a single layer of resist is applied to the electrical interconnects.

As depicted in FIG. 5E, the multiple layers of photoresist 252, 254, 256 are then exposed with ultraviolet light through a phototool containing multiple concentric rings creating slots 262, 264, 266 for rings. As depicted in FIG. 5F after the image is developed, copper is then electroformed up between the concentric rings of photoresist to form the copper rings 272, 274, 276. As depicted in FIG. 5G, after the resist between the electroformed rings is removed, the electroformed the electroformed rings are subsequently separated by etching away the thin layer of copper between the base of the rings, thereby electrically isolating the rings 272, 274, 276, as depicted in FIG. 5H. As depicted in FIG. 5I, the rings 272, 274, 276 are lightly sanded to flatten the top surface of the rings. A layer of photoresist 280 is applied to the sanded top surface of the rings. As depicted in FIG. 5J, the photo resist 280 is developed to expose the top surface of the rings. As depicted in FIG. 5K, the grooves 86 are etched into the top surface of each of the rings 272, 274, 276. As depicted in FIG. 5L, the layer of developed photoresist 280 is removed and the rings 272, 274, 276 are ready for nickel and gold plating.

The rings 272, 274, 276 include grooves 86 that are approximately 0.00825–0.010 inches wide. The rings 272, 274, 276 have a thickness of between approximately 0.012–0.014 inches. The rings 272, 274, 276 can be as close as 0.070 inches apart.

When the slip ring 41 is mated with brush block assemblies, it is important that the brush pressure be consistent over repeated cycling through the operational temperature range of –54° C. to +60° C.

To maintain boundary lubrication at low temperatures, there must be a lubricant placed on the electrical slip rings in the grooves 86 which must have fluid viscosity remaining low enough to prevent the viscosity/velocity product from reaching some critical value at which point the hydrodynamic lift will cause the contacts to separate. The critical value is a function of lubricant viscosity and lubricant quantity. Even though the quantity of lubricant required for boundary lubrication is smaller than that needed for full film lubrication, to a degree, the greater the quantity of lubricant present, the longer will be the life of the slip ring. But the greater the quantity, the easier it is for the lubricating mechanism to change from boundary lubricant to hydrodynamic lubrication, as the lubricant viscosity increases. Enough lubricant must be present, but not too much lubricant. Adding to the dilemma, fluids at work at very low temperatures are so volatile at room temperature (and higher) that they vaporize in a relatively short time. To reduce friction, a lubricant is used between the contact services and are coated with a lower molecular weight linear perfluoropolyether fluid or "Z" fluid, which have much improved viscosity indices (two to three times that of conventional fluid lubricants) and low vapor pressures, permitting operation over wider temperature ranges. Excessive wear can cause electrical noise and other electrical problems.

It should now be apparent that an electrical slip has been described that achieves high bandwidth. The present invention allows a ground plane between each layer of circuits, allows adjustment of ring and ground separations to minimize crosstalk and impedance mismatch, allows use of lubricants that remain fluid at low temperatures and provide adequate lubricity in low quantities, minimizes contamination of the materials during the ring buildup process that might cause high noise, and prevents formation of corrosion products on ring sidewalls through the use of a nickel barrier coat.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

What is claimed is:

1. A double sided flat composite electrical slip ring product produced by the method comprising the steps of:
    forming a plurality of concentric spaced electrical contacts on one side of a first non-conductive base and forming interconnecting electrical paths on an opposite side of the first non-conductive base;
    forming a plurality of concentric spaced electrical contacts on one side of a second non-conductive base and forming interconnecting electrical paths on an opposite side of the second non-conductive base;
    electrically connecting the electrical contacts and the interconnecting electrical paths on said first non-conductive base;
    electrically connecting the electrical contacts and the interconnecting electrical paths on the second non-conductive base;
    depositing copper on the electrical contacts to form electrical rings on the first non-conductive base;
    depositing copper on the electrical contacts to form electrical rings on the second non-conductive base;
    etching a groove into each of the electrical rings; and
    placing the opposite sides of the first and second non-conductive bases together to form the double sided flat composite electrical slip ring product.

2. The flat composite electrical slip ring product produced by the method of claim 1, comprising forming a double sided copper clad laminate on the non-conductive base, the copper clad laminate having a first side and a second side.

3. The flat composite electrical slip ring product produced by the method of claim 1, comprising coating at least one of the first side and the second side with a photosensitive polymer and exposing selected areas of the photosensitive polymer to a light source.

4. The flat composite electrical slip ring product produced by the method of claim 1, comprising dissolving away unexposed areas of a photosensitive polymer to expose copper cladding underneath and etching away exposed copper cladding.

5. The flat composite electrical slip ring product produced by the method of claims 1, comprising removing remaining unexposed photosensitive polymer and depositing copper on the exposed copper cladding to form built-up electrical contacts.

6. The flat composite electrical slip ring product produced by the method of claim 1, comprising coating built-up electrical contacts with a photosensitive polymer.

7. The flat composite electrical slip ring product produced by the method of claim 1, comprising exposing selected areas of the photosensitive polymer to a light source and dissolving away exposed areas of the photosensitive polymer to expose copper cladding underneath and etching away exposed copper cladding to form grooves in each built-up electrical contacts to form the electrical rings.

8. The flat composite electrical slip ring product produced by the method of claim 1, wherein the forming step includes forming a double sided copper clad laminate on the non-conductive base, the copper clad laminate having a first side and a second side, coating one of the first side and the second side with a photosensitive polymer and exposing selected areas of the photosensitive polymer to a light source, and dissolving away unexposed areas of the photosensitive polymer to expose the copper cladding underneath and etching away exposed copper cladding.

9. The flat composite electrical slip ring product produced by the method of claim 1, wherein said electrical connecting step includes drilling at least one hole through said non-conductive base and filling the at least one hole with an electrically conductive material.

10. The flat composite electrical slip ring product produced by the method of claim 1, further comprising applying a photosensitive polymer and wherein said depositing copper step includes removing remaining unexposed photosensitive polymer and depositing copper on the exposed copper cladding to form built-up electrical contacts.

11. The flat composite electrical slip ring product produced by the method of claim 1, wherein said etching step includes coating built-up electrical contacts with a photosensitive polymer and exposing selected areas of the photosensitive polymer to a light source and dissolving away exposed areas of the photosensitive polymer to expose copper cladding underneath and etching away exposed copper cladding to form grooves in each of the built-up electrical contacts to form the electrical rings.

12. The flat composite electrical slip ring product produced by the method of claim 1, wherein the grooves are approximately between 0.008 to 0.010 inches.

13. The flat composite electrical slip ring product produced by the method of claim 1, wherein said depositing step is performed before electrically connecting step.

14. The flat composite electrical slip ring product produced by the method of claim 1, wherein said electrically connecting step is performed before said depositing step.

15. A double sided flat composite electrical slip ring, comprising:
    a first electrically non-conductive base having a first side and a second side;
    a first plurality of concentric spaced electrical rings located on said first side of said first electrically non-conductive base, said slip rings being spaced from adjacent electrical rings at a distance of approximately 0.070 inches or greater;
    a second electrically non-conductive base having a first side and a second side;
    a second plurality of electrical rings located on said first side of said first electrically non-conductive base, said slip rings being spaced from adjacent electrical rings at a distance of approximately 0.070 inches or greater;
    first interconnecting electrical paths located on said second side of said first electrically non-conductive base;
    second interconnecting paths located on said second side of said second electrically non-conductive base;
    first connecting means for connecting said first plurality of electrical rings to said first interconnecting paths;
    second connecting means for connecting said second plurality of electrical rings to said second interconnecting paths wherein said second side of said first electrically non-conductive base and said second side of said second electrically non-conductive base are abutting each other.

16. The slip ring of claim 15, wherein each of said first and second electrically non-conductive bases are rotatable with a central shaft.

17. The slip ring of claim 16, further comprising a U-shaped annular frame stacker, each of said electrically non-conductive bases having an outer edge supported by said U-shaped frame stacker.

18. The slip ring of claim 15, further comprising a first brush block assembly in electrical contact with said first plurality of electrical rings and a second brush block assembly in electrical contact with said second plurality of electrical rings.

19. The slip ring of claim 15, wherein each of the electrical rings has a thickness of approximately between 0.012 to 0.014 inches.

20. The slip ring of claim 15, further comprising a plating on each of the plurality of electrical rings.

21. The slip ring of claim 15, wherein each of the electrical rings has grooves which are approximately between 0.008 to 0.010 inches wide.

* * * * *